United States Patent [19]

Folen et al.

[11] 4,078,186

[45] Mar. 7, 1978

[54] MAGNETICALLY TUNED, SURFACE ACOUSTIC WAVE DEVICE

[75] Inventors: Vincent J. Folen, Washington, D.C.; Carmine Vittoria, Bowie; Denis C. Webb, College Park, both of Md.; Kenneth L. Davis, Alexandria, Va.

[73] Assignee: The United States of America as represented by the Secretary of the Navy, Washington, D.C.

[21] Appl. No.: 734,690

[22] Filed: Oct. 21, 1976

[51] Int. Cl.² .................. H01L 41/10; H01L 41/14
[52] U.S. Cl. ................................. 310/313; 310/26; 333/30 R; 333/30 M
[58] Field of Search .............. 333/30 R, 30 M; 310/8.1, 9.7, 9.8, 26, 313

[56] References Cited

U.S. PATENT DOCUMENTS

| 2,834,943 | 5/1958 | Grisdale et al. | 310/26 X |
| 2,837,668 | 6/1958 | Simpson | 310/26 |
| 3,212,072 | 10/1965 | Fuller | 333/30 R X |
| 3,723,915 | 3/1973 | Adler et al. | 333/30 R |

Primary Examiner—Mark O. Budd
Attorney, Agent, or Firm—R. S. Sciascia; Philip Schneider

[57] ABSTRACT

A surface acoustic wave device having a thin magnetostrictive film deposited on the surface between its input and output transducers. A variable D.C. field is applied to the film to vary its characteristics and thereby correspondingly continuously vary the delay or phase shift of the surface acoustic wave.

10 Claims, 3 Drawing Figures

MAGNETICALLY TUNED, SURFACE ACOUSTIC WAVE DEVICE

BACKGROUND OF THE INVENTION

This invention relates to surface acoustic wave (SAW) devices and especially to a SAW device that is magnetically tuned.

SAW devices intrinsically have a fixed delay the amount of which is determined by material constraints and the physical separation between input and output terminals. In most present applications, any deviation from this fixed delay is achieved by placing a series of fixed taps between the input and the output to obtain a stepwise variable delay. A few techniques have been proposed for obtaining continuously variable delays with SAW devices but these have a number of limitations. For example: (a) Mechanically variable devices are quite difficult to fabricate and the delay changes can be made only very slowly; (b) A technique involving dispersive delay lines can be used to achieve large variable delays but it involves a highly complex system and suffers from high insertion loss.

An electronically variable phase shift can be obtained by making use of phonon-electron interactions in a piezo-electric semi-conductor or adjacent semiconductor and piezo-electric materials. However, such devices involve specialized configurations and are thus not adaptable to many standard SAW devices.

An object of the present invention is to vary the delay and phase shift of an SAW device electrically so that rapid and continuous changes in delay and phase shift are provided.

Another object is to provide a simple SAW device in which such changes are possible.

A further object is to provide such a SAW device which also has a small insertion loss.

Other objects, advantages and novel features of the invention will become apparent from the following detailed description of the invention when considered in conjunction with the accompanying drawings wherein:

DETAILED DESCRIPTION OF THE INVENTION

Figure 1:
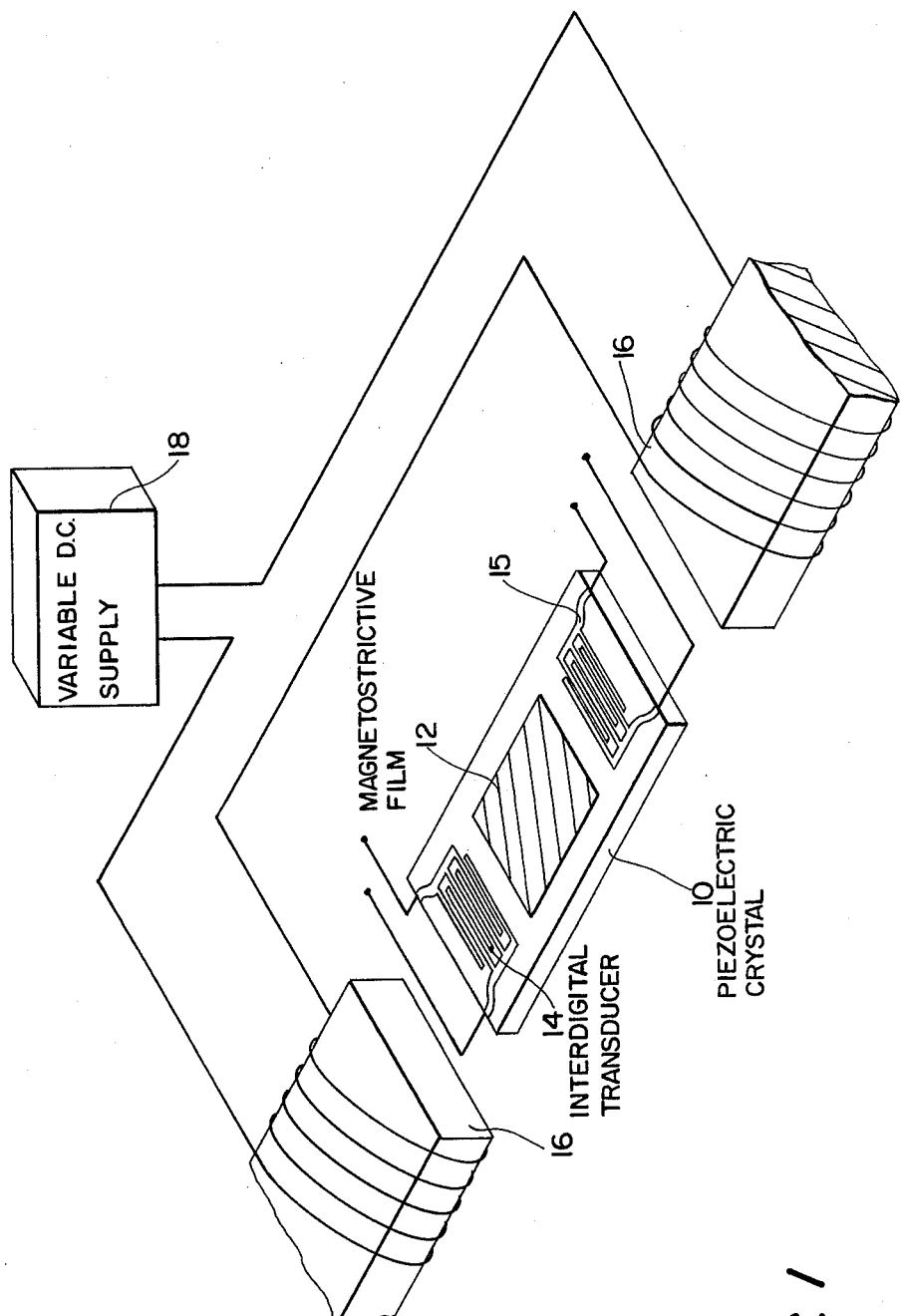
FIG. 1 is an isometric view of an embodiment of the invention.

FIG. 1 shows an embodiment of the present invention. A SAW device comprising a piezoelectric crystal substrate 10 is formed with interdigital transducer input and output means 14 and 15 on one surface. A magnetostrictive thin film 12 is deposited on the same surface in the path of the surface acoustic waves which will be propagated between the transducers. The film 12 is biased by a variable D.C. magnetic field, H$_o$, which can be produced by placing the poles 16 of an electromagnet in line with the plane of the film, for example. The current through the winding of the electromagnet is obtained from a continuously variable D.C. supply source 18.

The substrate 10 may be formed from any acoustic piezoelectric material with a high acoustic Q, such as lithium niobate (LiNbO$_3$), quartz, or spinel. The higher the Q of the material, the better.

The film 12 is formed from a material which has high magnetostriction and good bonding to the substrate material. The higher the magnetostriction, the larger the phase shift (or delay range) which is obtainable. Nickel (Ni) may be used but the new rare-earth-transition metal alloys, such as a low magneto crystalline anisotropy terbium dysprosium iron alloy, are even better because they manifest much greater magnetostriction than that in nickel.

The thickness of the film is typically in the 0.5 – 10 $\mu$m range.

Because of the magneto-elastic coupling, arising from magnetostriction of the film, the magnetic film imposes a physical constraint on elastic motion at the film-piezoelectric substrate interface. This, in turn, alters the phase and group velocity of the SAW. Since the amount of magnetostrictive strain in the film depends on the strength of the applied magnetic field (strength of the D.C. current), the bias field can be used to vary the phase and group velocity of the SAW.

Any type of transducer or array of multiple transducers associated with SAW techniques can be used.

The substrate need not be piezoelectric since the coupling to the magnetic film is purely mechanical. The substrate can be any material which is capable of supporting surface wave propagation and to which the film can be well bonded. The piezoelectric materials are used because they are more efficient surface wave propagators.

The configuration may be more general than that in FIG. 1. It may be advantageous to deposit or etch the film in the form of a pattern, e.g., arrays of segments or lens-shaped patterns. This may be done so long as the film is still planar.

Figure 2A:
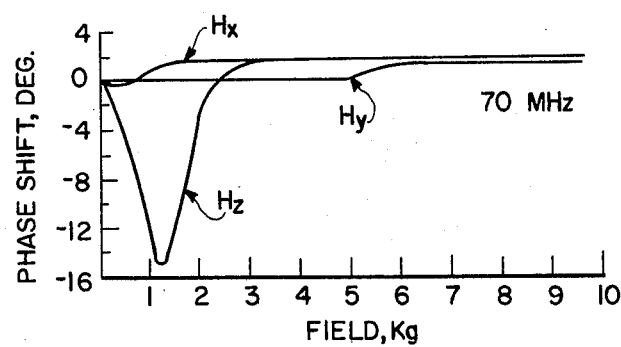
FIG. 2A is a set of curves showing phase shift v. magnetic field strength characteristics for a Ni film on LiNbO$_3$ substrate at 70 MHz.
Figure 2B:
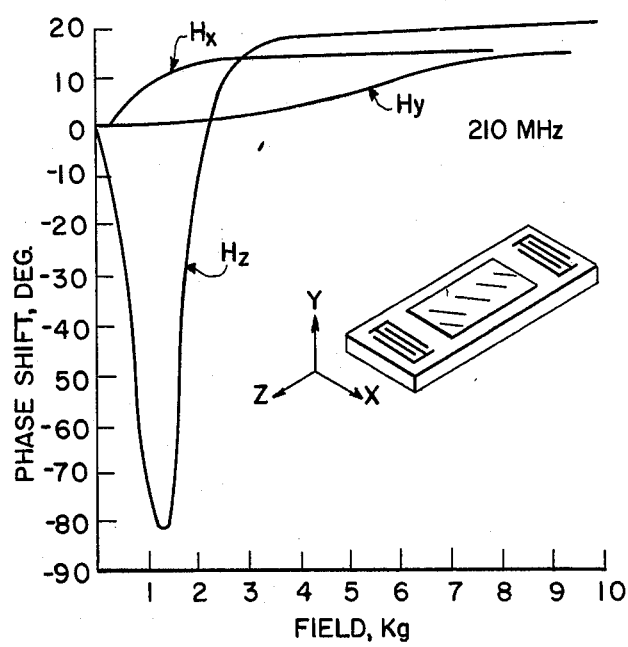
FIG. 2B is a set of curves showing the same characteristics of the same device at 210 MHz.

The phase shift v. magnetic field strength characteristics of an embodiment of the invention are shown in FIGS. 2A and 2B for a device comprising a yzLiNbO$_3$ substrate on which a 0.85 $\mu$m, Ni, magnetostrictive film is deposited by thermal evaporation. Interdigital input and output transducers are employed, the input transducer being driven by an oscillator which generates a sine wave signal at 70 MHz for one set of curves (FIG. 2A) and at 210 MHz for a second set of curves (FIG. 2B). The measured delay through the device was 4.7 $\mu$sec at 70 MHz and 5.2 $\mu$sec at 210 MHz. The phase shift through the device was measured in a straightforward manner using a vector voltmeter.

The dependence of phase shift on the applied direct-bias field is shown in FIG. 2. The field directions $y$, and $z$ are defined by a coordinate system shown in the inset in FIG. 2B, which figure will now be discussed.

Case (a): H$_o$ is parallel to the direction of acoustic-wave propagation (H$_o$=H$_z$). Owing to a static stress in the plane of the nickel film, a torque exists which tends to align the moments. Such a stress is always present in deposited-film structures. The direction of the net moment or 'easy' axis is determined by the sign of the product of the magnetostrictive constant $\lambda$ and the stress $\sigma$. In the Ni-LiNbO$_3$ system, the easy axis is normal to the plane of the film. The H$_z$ field rotates the moments toward the plane, changing the effective elastic constants and hence the velocity of acoustic surface waves. The SAW velocity first decreases, attaining a minimum value when the moments make an angle of approximately 45° with the direction of H$_z$, and then increases with increasing bias field until the moments reach the direction of the applied field. As the field is increased further, the velocity increases slowly. The velocity change in this region is caused by the increase of the precession frequency of the moments with applied field. The SAW device would normally be operated on the descending portion of the $H_z$ curve with a bias field varying from 0 to approximately 1 Kgauss.

Case (b): $H_o$ is normal to the plane of the film ($H_o = H_y$). In this case $H_o$ has to overcome the effect of the demagnetizing field. For $H_o > 4\pi M_o$, $M_o$ being the saturation moment, all moments will line up in the field direction. The calculated velocity for case (b) does not change until $H_o > 4\pi M_o$, and then the SAW velocity increases monotonically with applied field.

Case (c): $H_o$ is in the plane of the film, but orthogonal to the direction of acoustic propagation ($H_o = H_x$). Unlike case (a), the moments here rotate from a direction where they couple with acoustic signals to a direction where they do not. Since the velocity in the uncoupled case is high than in the coupled case, the velocity increases monotonically with applied field.

Obviously many modifications and variations of the present invention are possible in light of the above teachings. It is therefore to be understood that within the scope of the appended claims the invention may be practiced otherwise than as specifically described.

What is claimed and designed to be secured by letters Patent of the United States is:

1. In a SAW device comprising a substrate capable of supporting surface wave propagation and having an input transducer and an output transducer both mounted on a surface of said substrate, the improvement comprising:
   a thin film of magnetostrictive material bonded to said surface of said substrate in the path of propagation of surface waves generated by said input transducer; and
   means for applying a continuously variable, D.C. magnetic field to said film to continuously vary the signal propagation velocity.

2. The improvement of claim 1, wherein:
the direction of said D.C. magnetic field is the same as the direction of propagation of said acoustic wave.

3. The improvement of claim 1, wherein:
the thickness of said film lies in the approximate range of 0.5 to 10 μm.

4. The improvement of claim 1, wherein:
the film is fabricated from a rare-earth alloy exhibiting high magnetostriction and low magneto crystalline anisotropy.

5. The device of claim 1, wherein:
said substrate is formed from $LiNbO_3$ and said film is formed from Ni.

6. A SAW device is continuously tunable comprising:
   a substrate having a surface and formed from an acoustic piezoelectric material;
   input and output transducer means spaced from each other and mounted on said substrate surface so that an acoustic surface wave can be propagated along said surface from the input to the output transducer means;
   a thin film of magnetostrictive material bonded to said surface in the path of propagation of surface wave generated by said input transducer; and
   means for applying a continuously variable D.C. magetic field to said film to continuously vary the acoustic surface wave velocity.

7. The device of claim 6, wherein:
the direction of said D.C. magnetic field is the same as the direction of propagation of said acoustic wave.

8. The device of claim 6, wherein:
the thickness of said film lies in the approximate range of 0.5 to 10 μm.

9. The device of claim 6, wherein:
the film is fabricated from a rare-earth alloy exhibiting high magnetostriction.

10. The device of claim 6, wherein:
said substrate is formed from $LiNbO_3$ and said film is formed from Ni.

* * * * *